(12) United States Patent
Takao

(10) Patent No.: US 7,906,400 B2
(45) Date of Patent: Mar. 15, 2011

(54) METHOD OF MANUFACTURING A SEMICONDUCTOR DEVICE HAVING TRANSISTORS AND SEMICONDUCTOR DEVICE HAVING TRANSISTORS

(75) Inventor: Yoshihiro Takao, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 177 days.

(21) Appl. No.: 12/052,216

(22) Filed: Mar. 20, 2008

(65) Prior Publication Data
US 2008/0230850 A1 Sep. 25, 2008

(30) Foreign Application Priority Data

Mar. 20, 2007 (JP) ................................. 2007-072905

(51) Int. Cl.
*H01L 21/336* (2006.01)
(52) U.S. Cl. ........ 438/303; 438/305; 438/546; 438/551; 438/E21.618
(58) Field of Classification Search .......... 438/367–377, 438/301–303, 550–553, 546, 736, 505–506, 438/519–521, 514, 527
See application file for complete search history.

(56) References Cited

U.S. PATENT DOCUMENTS 7,569,898 B2 * 8/2009 Kato et al. ..................... 257/392
7,605,041 B2 * 10/2009 Ema et al. ..................... 438/289

FOREIGN PATENT DOCUMENTS

JP 2004-14779 A 1/2004

* cited by examiner

*Primary Examiner* — Dung A. Le
(74) *Attorney, Agent, or Firm* — Fujitsu Patent Center

(57) ABSTRACT

A method of manufacturing a semiconductor device includes forming a first mask pattern exposing a first region for forming a first transistor and a second region for forming a second transistor, performing a first ion implantation for forming well regions using the first mask pattern, performing a second ion implantation for threshold voltage (Vth) adjustment of the first transistor using the first mask pattern, removing the first mask pattern and forming a second mask pattern in which the first region is covered and the second region is opened, performing a third ion implantation for Vth adjustment of the second transistor using the second mask pattern, forming first and second gate insulating films in the first and second regions respectively, and forming first and second gate electrodes in the first and second regions respectively.

8 Claims, 12 Drawing Sheets

METHOD OF MANUFACTURING A SEMICONDUCTOR DEVICE HAVING TRANSISTORS AND SEMICONDUCTOR DEVICE HAVING TRANSISTORS

CROSS-REFERENCE TO RELATED APPLICATIONS

This application is based upon and claims the benefits of priority from the prior Japanese Patent Application No. 2007-072905, filed on Mar. 20, 2007, the entire contents of which are incorporated herein by reference.

BACKGROUND OF THE INVENTION

The present invention relates to a method of manufacturing a semiconductor device and to a semiconductor device manufactured by the method. More particularly, the present invention relates to a method of manufacturing a semiconductor device including a plurality of Metal Oxide Semiconductor field effect transistors (MOSFETs) having different operating voltages. The invention also pertains to a semiconductor device manufactured by the method.

In recent LSIs, a MOSFET (HV-Tr) operating at relatively high voltages such as 3.3 V and 2.5 V like I/O transistors and a MOSFET (LV-Tr) operating at relatively low voltages such as 1.2 V like high performance logic transistors are often mounted mixedly on the same substrate.

When the HV-Tr and LV-Tr having different operating voltages are thus mixedly mounted on the same substrate, the following steps must be performed. That is, sizes of constituent elements, for example gate insulating film or gate electrode, of the respective transistors are optimized. Alternatively, impurities (dopants) are doped, under conditions suitable for the respective transistors, by ion implantation into channel forming regions of the transistors to adjust threshold voltages (Vths). Further, there has been conventionally proposed a method of forming a punch-through stopper structure suitable for each transistor to prevent the so-called punch-through phenomenon.

When complementary HV-Trs and LV-Trs are mixedly mounted, ion implantations for Vth adjustment are performed into channel forming regions of the respective n-channel and p-channel HV-Trs and into channel forming regions of the respective n-channel and p-channel LV-Trs, respectively. More specifically, at least four types (sheets) of reticles are required for the ion implantation for Vth adjustment.

Before performing the ion implantations for Vth adjustment, there are usually performed ion implantations for forming p-well regions both of the n-channel HV-Tr and LV-Tr, and n-well regions both of the p-channel HV-Tr and LV-Tr, respectively. When those ion implantations are added, at least a total of six reticles are required by the time the ion implantations for Vth adjustment are completed.

When the number of used reticles thus increases, the number of processes increases and the LSI production cost including the reticle fabrication cost disadvantageously increases.

SUMMARY OF THE INVENTION

According to one aspect of the present invention, a method of manufacturing a semiconductor device has forming a first mask pattern exposing a region for forming a first transistor and a region for forming a second transistor, performing a first ion implantation using the first mask pattern, performing a second ion implantation using the first mask pattern, removing the first mask pattern and forming a second mask pattern in which the first transistor forming region is covered and the second transistor forming region is opened, and performing a third ion implantation using the second mask pattern.

DESCRIPTION OF THE PREFERRED EMBODIMENTS

Figure 1:
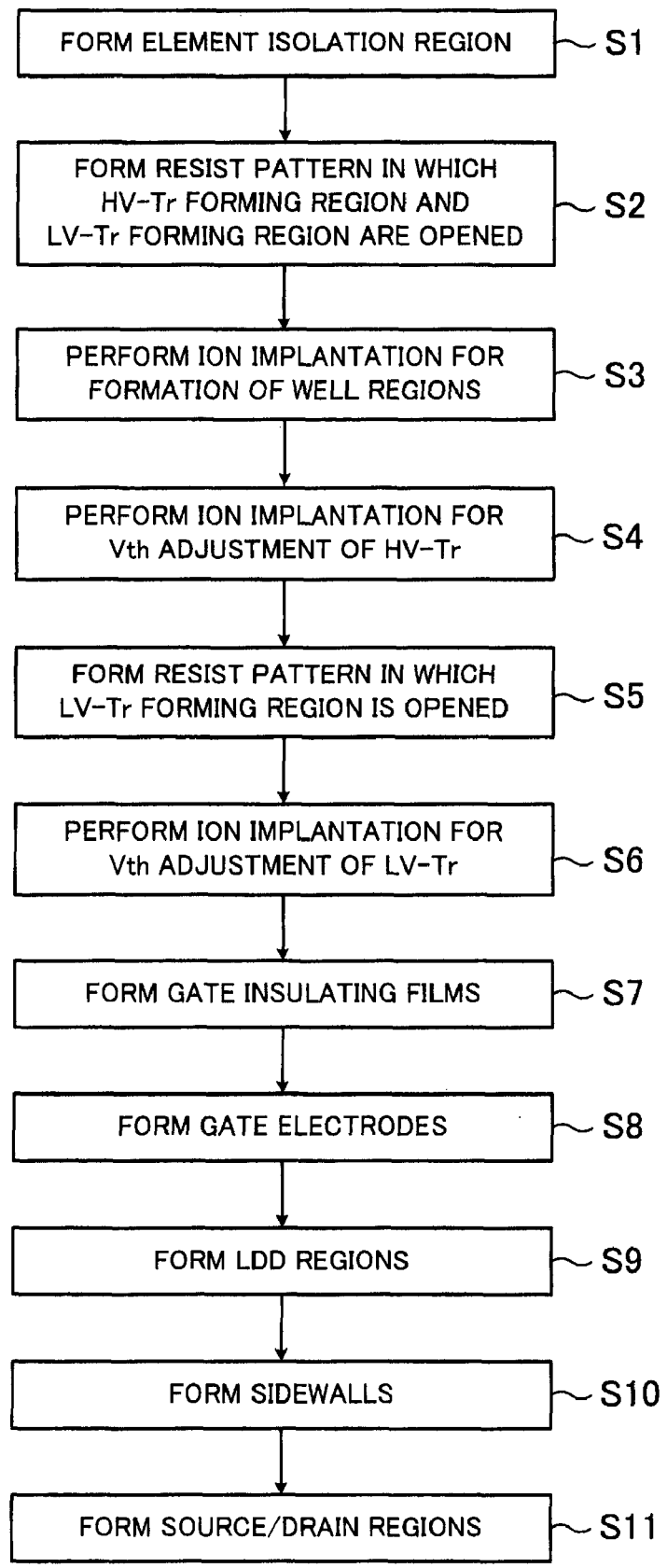
FIG. 1 illustrates a flow of a method of forming a semiconductor device.

Preferred embodiments of the present invention will be described in detail below with reference to the accompanying drawings, wherein like reference numerals refer to like elements throughout.

Figure 2:
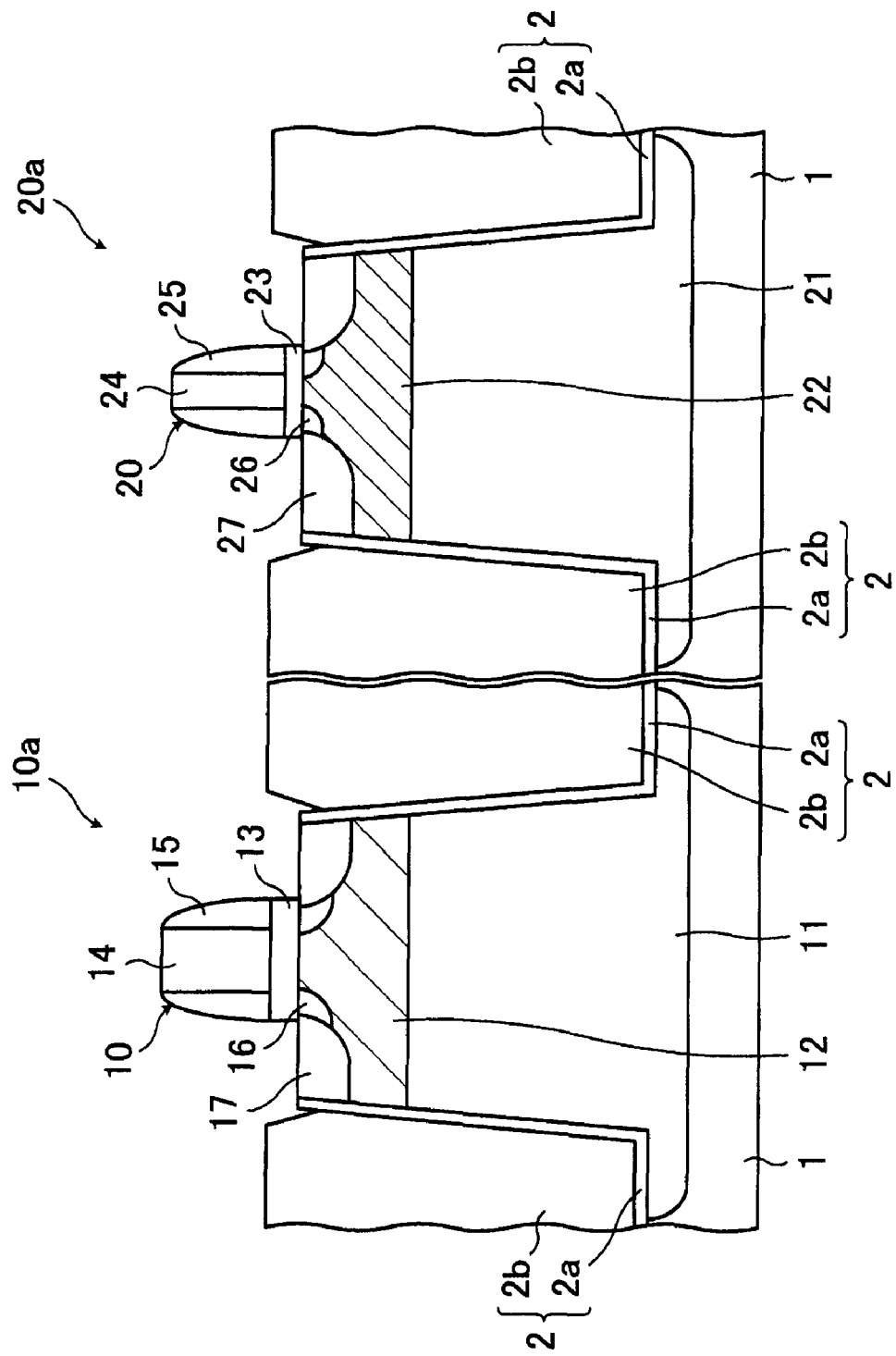
FIG. 2 shows a constitution example of a semiconductor device.

FIG. 1 illustrates a flow of a method of forming a semiconductor device and FIG. 2 shows a constitution example of a semiconductor device.

FIG. 2 shows a structure in which a HV-Tr 10 and a LV-Tr 20 having different operating voltages are formed in each active region delimited by an element isolation region 2 of a semiconductor substrate 1. The HV-Tr 10 and the LV-Tr 20 are of the same channel type, that is, both the transistors are of an n-channel type or a p-channel type.

The HV-Tr 10 has the following structure. Over the semiconductor substrate 1 having formed therein a well region 11 and a region 12 for adjusting a Vth (Vth adjusting region), a gate electrode 14 is formed through a gate insulating film 13, and a sidewall 15 is formed on a side wall of the gate electrode 14. Further, an LDD region 16 and a source/drain region 17 are formed within the semiconductor substrate 1 on both sides of the gate electrode 14.

Likewise, the LV-Tr 20 has the following structure. Over the semiconductor substrate 1 having formed therein a well region 21 and a Vth adjusting region 22, a gate insulating film 23, a gate electrode 24 and a sidewall 25 are formed. Further, an LDD region 26 and a source/drain region 27 are formed within the semiconductor substrate 1 on both sides of the gate electrode 24. The gate insulating film 23 of the LV-Tr 20 is formed more thinly than the gate insulating film 13 of the HV-Tr 10. The gate electrode 24 is formed more thinly than the gate electrode 14 of the HV-Tr 10. The LDD region 26 is formed in a region shallower than the LDD region 16 of the HV-Tr 10.

Here, the HV-Tr 10 and the LV-Tr 20 having the above-described structures are formed according to the following flow. Here, description will be made by taking as an example a case where the LV-Tr 20 having a thinner gate insulating film and a shorter gate length than the HV-Tr 10 requires a Vth adjustment implantation at a higher concentration than the HV-Tr 10.

First, the element isolation region 2 is formed in the semiconductor substrate 1 (step S1), thereby delimiting a region (HV-Tr 10 forming region) 10a for forming the HV-Tr 10 and a region (LV-Tr 20 forming region) 20a for forming the LV-Tr 20.

After formation of the element isolation region 2, a resist pattern in which both of the HV-Tr forming region 10a and the LV-Tr forming region 20a are opened is formed (step S2). Using the resist pattern as a mask, ion implantation for formation of the well regions 11 and 21 is then performed. Specifically, a predetermined conductivity-type dopant such as boron (B) and phosphorus (P) is ion-implanted under predetermined conditions according to the channel type of the HV-Tr 10 and the LV-Tr 20, thereby collectively forming the well regions 11 and 21 in the HV-Tr forming region 10a and the LV-Tr forming region 20a (step S3).

After formation of the well regions 11 and 21 in steps S2 and S3, ion implantation for Vth adjustment of the HV-Tr 10 is performed using the resist pattern used for the formation. Specifically, into the HV-Tr forming region 10a and the LV-Tr forming region 20a, a dopant such as boron (B) and arsenic (As) having the same conductivity type as that of the well regions 11 and 21 is ion-implanted under predetermined conditions according to the channel type of the HV-Tr 10 and the LV-Tr 20 (step S4). This ion implantation in step S4 is performed under such conditions that the Vth of the HV-Tr 10 can be adjusted to a predetermined value.

After the ion implantation for Vth adjustment of the HV-Tr 10 in step S4, a resist pattern in which only the LV-Tr forming region 20a is opened is formed (step S5). Using the resist pattern as a mask, the ion implantation for Vth adjustment of the LV-Tr is then performed. Specifically, according to the channel type of the HV-Tr 10 and the LV-Tr 20, a dopant such as B and As having the same conductivity type as that used in the ion implantation in step S3 is ion-implanted under predetermined conditions (step S6). This ion implantation in step S6 is performed under such conditions that the Vth of the LV-Tr 20 can be adjusted to a predetermined value. More specifically, this ion implantation is performed under such conditions that the Vth of the LV-Tr 20 can be adjusted to a predetermined value by the dopant implanted in step S6 and the dopant simultaneously implanted into the HV-Tr forming region 10a and the LV-Tr forming region 20a in previous step S4.

After the ion implantation for Vth adjustment of the LV-Tr 20 in step S6, the gate insulating films 13 and 23 having predetermined thicknesses are formed in the HV-Tr forming region 10a and the LV-Tr forming region 20a, respectively (step S7). Subsequently, the gate electrodes 14 and 24 having predetermined widths are formed in the HV-Tr forming region 10a and the LV-Tr forming region 20a, respectively (step S8). Thereafter, the respective forming steps of the LDD regions 16 and 26, the sidewalls 15 and 25, and the source/drain regions 17 and 27 are accomplished (steps S9 to S11) and thereby, the HV-Tr 10 and the LV-Tr 20 are formed in the HV-Tr forming region 10a and the LV-Tr forming region 20a, respectively.

Here, the steps from the formation of the well regions 11 and 21 to the adjustment of the respective Vths of the HV-Tr 10 and the LV-Tr 20 in steps S2 to S6 are taken notice of.

The ion implantation for Vth adjustment of the HV-Tr 10 in step S4 is performed continuously using the resist pattern used during the formation of the well regions 11 and 21 in steps S2 and S3, in which both of the HV-Tr forming region 10a and the LV-Tr forming region 20a are opened. Thereafter, the flow proceeds to steps S5 and S6, and the ion implantation for Vth adjustment of the LV-Tr 20 is performed using the resist pattern in which only the LV-Tr forming region 20a is opened.

Thus, two kinds of resist patterns are used in steps S2 to S6, and two sheets of reticles are used to form such resist patterns. That is, it is not required to form the resist pattern in which only the HV-Tr forming region 10a is opened as usual for the Vth adjustment of the HV-Tr 10. Therefore, one sheet of the reticles for forming such a resist pattern becomes unnecessary.

In the case of forming the HV-Tr 10 and LV-Tr 20 having the same channel type as well as the HV-Tr and LV-Tr having the channel type opposite thereto and of mounting a total of four different transistors on the same substrate, a total of six different resist patterns, namely, six sheets of reticles are required from formation of well regions to completion of Vth adjustment of all the transistors. However, when a flow of the above-described steps S2 to S6 is used, a total of four reticles are enough.

When the number of reticles is thus reduced, the forming step and subsequent removing step of the resist pattern can also be omitted. As a result, it becomes possible to reduce the cost required for forming the semiconductor device having the above-described structure as well as to efficiently form such a semiconductor device.

Subsequently, conditions for the ion implantations performed in steps S2 to S6 will be described.

First, a relationship between the ion implantation (step S3) for formation of the well regions 11 and 21, and the ion implantation (steps S4 and S6) for Vth adjustment of the HV-Tr 10 and the LV-Tr 20 will be described.

The ion implantation for formation of the well regions 11 and 21 is performed at sufficiently high implantation energy (acceleration voltage) as compared with the ion implantation for Vth adjustment of the HV-Tr 10 and the LV-Tr 20. When the above-described conditions are used, there can be suppressed an influence that the dopant implanted into the semiconductor substrate 1 by the ion implantation for formation of the well regions 11 and 21 will have on the Vths of the HV-Tr 10 and the LV-Tr 20. Therefore, the respective Vths of the HV-Tr 10 and the LV-Tr 20 can be accurately adjusted by the ion implantation for Vth adjustment.

Next, a relationship between the ion implantation (step S4) for Vth adjustment of the HV-Tr 10 and the ion implantation (step S6) for Vth adjustment of the LV-Tr 20 will be described.

As described above, the Vth of the LV-Tr 20 is finally adjusted by two ion implantations in steps S4 and S6. For example, when both times of the ion implantation are performed by implanting dopants comprising the same constituent element, each ion implantation is performed at the same implantation energy. When each implantation energy is changed, a concentration peak position in the depth direction of the dopant implanted by each ion implantation varies and as a result, it becomes impossible to adjust the Vth of the LV-Tr 20 to the predetermined value by two ion implantations.

On the other hand, the Vth of the HV-Tr 10 is adjusted only by the ion implantation in step S4. The implantation energy is set to the implantation energy necessary for adjusting the Vth of the LV-Tr 20 to the predetermined value, namely, to the same implantation energy as that used in two ion implantations performed on the LV-Tr 20 side. Therefore, the concentration peak position in the depth direction of the dopant for adjusting the Vth of the HV-Tr 10 and that of the LV-Tr 20 have the same depth.

So far, the implantation energy used in the ion implantation for Vth adjustment of the HV-Tr has been set higher than that used in the ion implantation for Vth adjustment of the LV-Tr. This is for the following reason. That is, since a high voltage is applied to the HV-Tr 10, hot carriers may be generated near the drain of the HV-Tr 10. In order to suppress a decrease in reliability due to such hot carriers, the HV-Tr is designed such that an LDD region deeper than that of the LV-Tr 20 is formed to reduce an electric field strength near the drain. In that case, to suppress short channel effects, the concentration peak position of the dopant for adjusting the Vth of the HV-Tr 10 is generally set to a depth according to a junction depth of the LDD region of the HV-Tr 10. Due to the above-described reason, the implantation energy used in the ion implantation for Vth adjustment of the HV-Tr has been set higher than that used in the ion implantation for Vth adjustment of the LV-Tr.

In contrast, in the forming method shown in FIG. 1, the implantation energy used in the ion implantation for Vth adjustment of the HV-Tr 10 is set equally to that used in the ion implantation for Vth adjustment of the LV-Tr 20. In the LV-Tr 20, since the LDD region 26 shallower than the LDD region 16 of the HV-Tr 10 is formed for the purpose of suppressing the short channel effects, high implantation energy as used in the conventional Vth adjustment of the HV-Tr cannot be used in the Vth adjustment. Therefore, the implantation energy in the Vth adjustment of the LV-Tr 20 is used in the Vth adjustment of the HV-Tr 10.

Note, however, that when such implantation energy is used in the Vth adjustment of the HV-Tr 10, gate-length dependence (roll-off characteristics) of Vth of the HV-Tr 10 increases.

Figure 3:
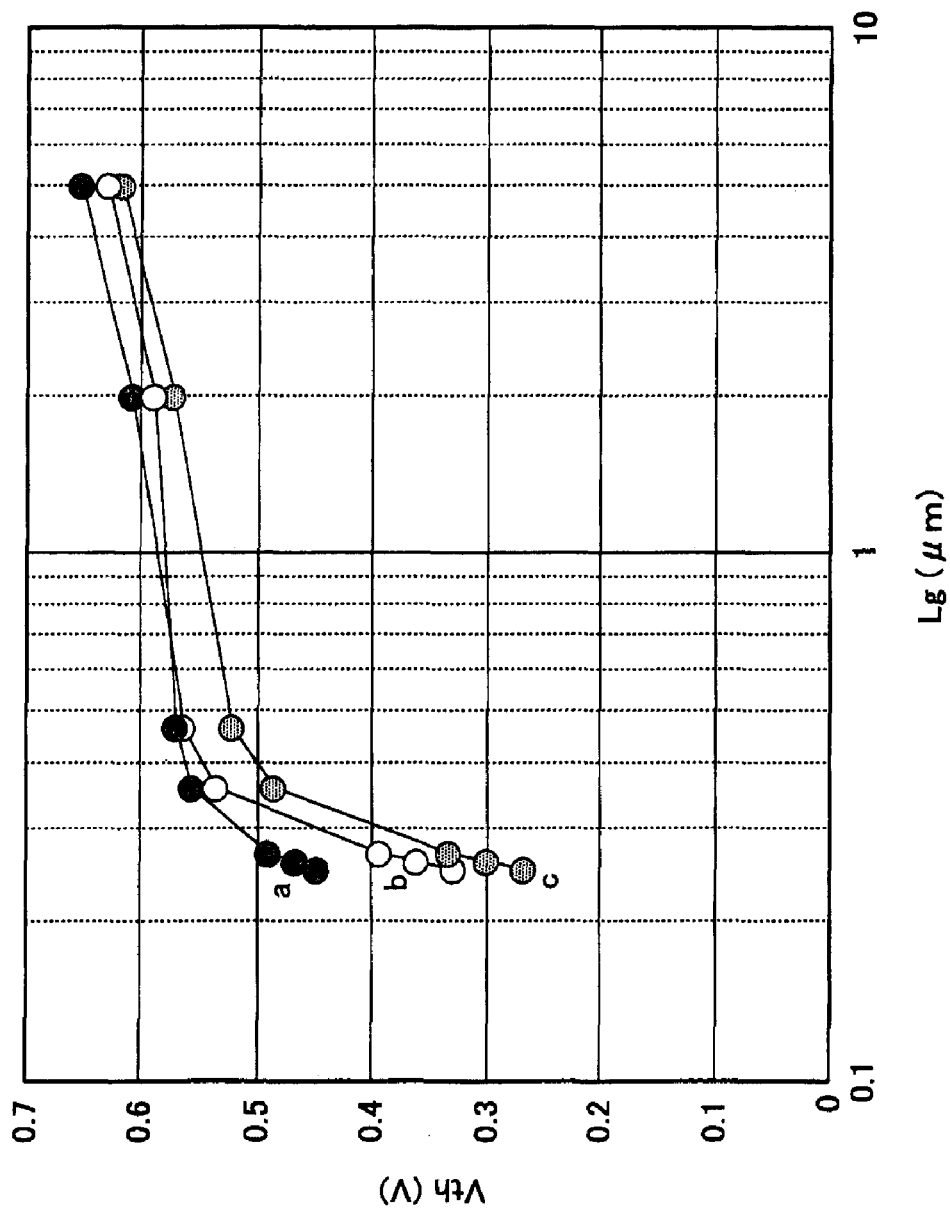
FIG. 3 shows one example of roll-off characteristics of a HV-Tr.

FIG. 3 shows one example of roll-off characteristics of the HV-Tr.

In FIG. 3, the horizontal axis represents the gate length Lg (µm), and the vertical axis represents the Vth (V) of the HV-Tr. FIG. 3 shows the roll-off characteristics at the time of changing the implantation energy used in the Vth adjustment of the HV-Tr 10. Here, three kinds of implantation energy a, b and c (a>b>c) are used and the same dopant is adopted in each case.

As shown in FIG. 3, as the implantation energy used in the Vth adjustment of the HV-Tr decreases in the order of "a", "b" and "c", that is, as the concentration peak position of the dopant for Vth adjustment becomes shallower, the roll-off characteristics more deteriorate particularly in the region where the gate length is short, in other words, the characteristics at the time of "b" and "c" deviate from those at the time of "a".

However, in the real semiconductor device including the HV-Tr 10 and the LV-Tr 20 mixedly mounted as described above, dimensional variations of the gate electrode 24 in the formation of the LV-Tr 20 are sufficiently small as compared with those of the gate electrode 14 in the formation of the HV-Tr 10. Further, Vth variations of the HV-Tr 10 never exceed the standard extent. Accordingly, even if the implantation energy used in the Vth adjustment of the HV-Tr 10 is set equally to that in the Vth adjustment of the LV-Tr 20, a predetermined performance can be secured in the semiconductor device including the HV-Tr 10 and the LV-Tr 20 mixedly mounted.

In order to increase the Vth only in the region having a short gate length in the HV-Tr 10, a dopant having the same conductivity type, the conductivity type opposite to that of the LDD region 16, as that of a dopant for Vth adjustment may be ion-implanted to form a pocket region (not shown in FIG. 2) near the LDD region 16. By thus forming the pocket region, roll-off characteristics in the region having a short gate length can be improved to improve roll-off characteristics throughout the whole gate length region.

As described above, when the forming method shown in FIG. 1 is used, the semiconductor device having a structure as shown in FIG. 2 can be efficiently formed at low cost while securing the predetermined performances.

In the above description, there is described a case where for adjustment of the respective Vths of the HV-Tr 10 and the LV-Tr 20, the same dopant is used in two ion implantations in steps S4 and S6. Further, different dopants may be used in the two ion implantations. In this case, different implantation energy may be used in the two ion implantations.

For example, for the ion implantation of step S4, a dopant having a relatively small mass number such as B and As is used according to the channel type and implanted at predetermined implantation energy. For the ion implantation of step S6, a dopant having a relatively large mass number such as In and Sb is used according to the channel type and implanted at predetermined higher implantation energy. In doing so, the concentration peak positions of the dopants implanted by the two ion implantations have the same depth as well as the respective Vths of the HV-Tr 10 and the LV-Tr 20 are adjusted with high accuracy.

When using such a method, the Vth of the HV-Tr 10 is adjusted only by a dopant having a small mass number and the Vth of the LV-Tr 20 is adjusted by both of a dopant having a small mass number and a dopant having a large mass number. In general, a dopant having a large mass number is effective in suppression of short channel effects so as to suppress characteristic variations of microtransistors. Therefore, the dopant having a large mass number is suitable for the LV-Tr 20. On the other hand, such a dopant having a large mass number easily causes a damage such as crystal defects to the semiconductor substrate 1 so as to increase the likelihood that a leakage current will occur in a transistor operating at a high voltage. Therefore, the dopant having a large mass number is unsuitable for the HV-Tr 10. In the LV-Tr 20 operating at a low voltage, such damage causes no serious problem, as compared with the HV-Tr 10. Therefore, by using the above-described method, the LV-Tr 20 suppressed in short channel effect can be obtained as well as the HV-Tr 10 suppressed in leakage current can be obtained.

A method of forming a semiconductor device having the structure as shown in FIG. 2 will be described in detail below with reference to FIG. 2 and FIGS. 4 to 12. Each step will be sequentially described below.

Figure 4:
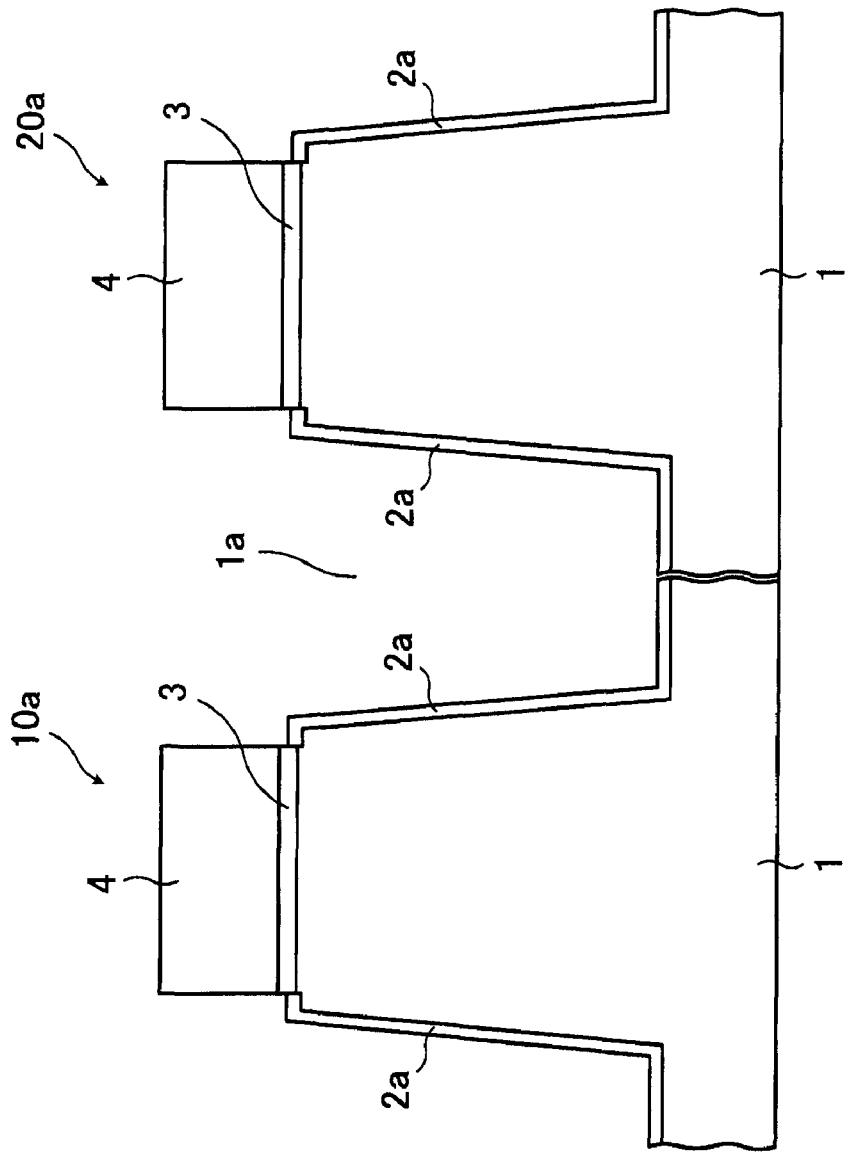
FIG. 4 is a schematic sectional view showing a trench forming step.

FIG. 4 is a schematic sectional view showing a trench forming step.

Using a silicon substrate as the semiconductor substrate 1, a silicon dioxide film 3 and a silicon nitride film 4 are first sequentially formed over the semiconductor substrate 1. Then, the silicon nitride film 4 and the silicon dioxide film 3 are patterned and an exposed portion of the semiconductor substrate 1 is etched. Thus, a trench 1a having, for example, a depth of 300 nm is formed in the semiconductor substrate 1.

After formation of the trench 1a, oxidization or oxynitridation is performed to form over an inner surface of the trench 1a a silicon dioxide film or silicon oxynitride film 2a having, for example, a thickness of 5 nm. This silicon dioxide film or silicon oxynitride film 2a is formed mainly for the purpose of recovering a damage caused by the etching during the formation of the trench 1a and for the purpose of enhancing adhesion with the silicon dioxide film subsequently formed to embed the trench 1a.

Figure 5:
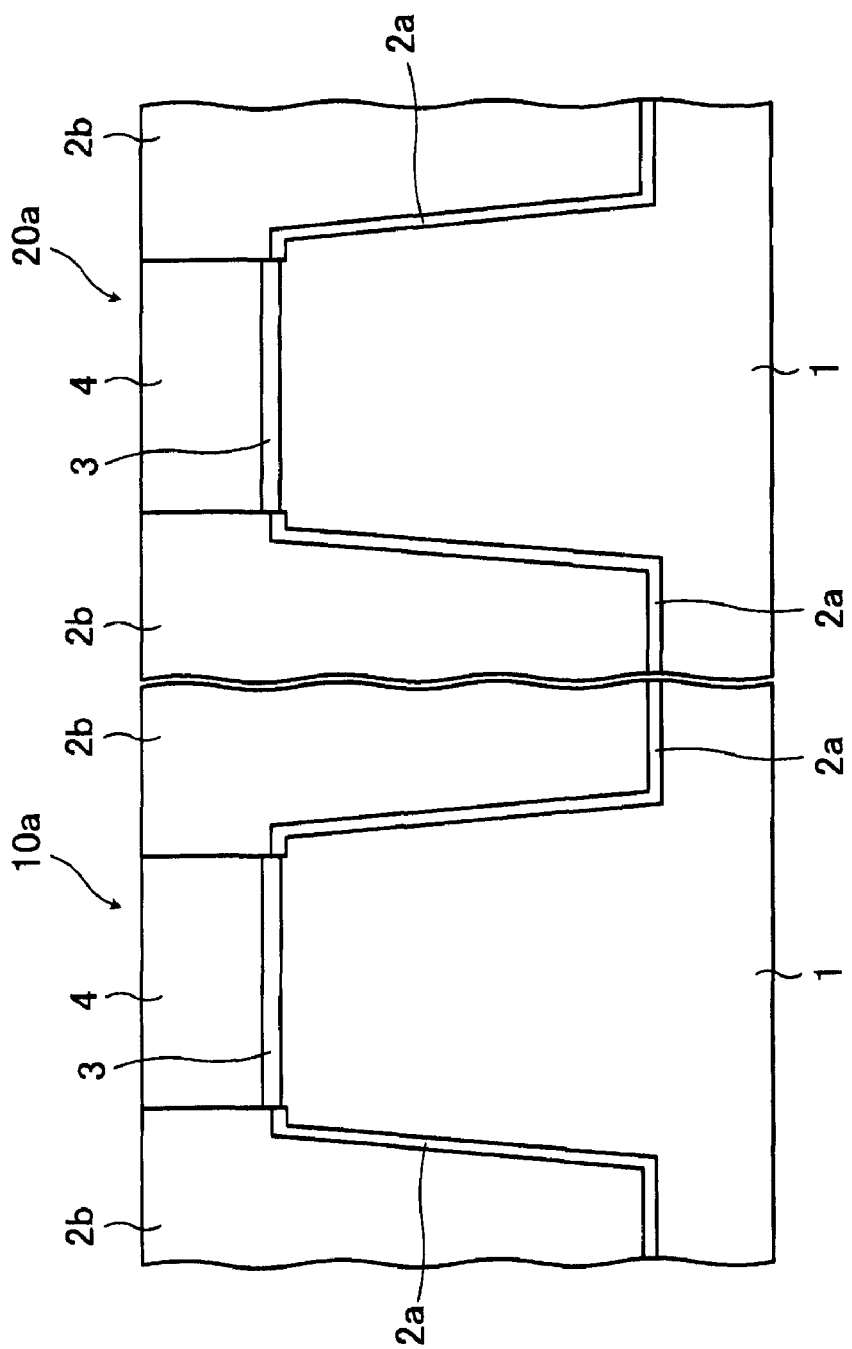
FIG. 5 is a schematic sectional view showing a trench embedding step.

FIG. 5 is a schematic sectional view showing a trench embedding step.

Over the whole surface, a silicon dioxide film (a buried oxide film) 2b having a thickness of 500 nm is deposited using, for example, a thermal Chemical Vapor Deposition (CVD) method to embed the trench 1a. Further, this buried oxide film 2b is removed, for example, by Chemical Mechanical Polishing (CMP) until the silicon nitride film 4 is exposed. Here, this removal of the buried oxide film 2b can also be performed by Reactive Ion Etching (RIE) in place of CMP.

Thereafter, annealing is performed, for example, at 1000° C. for 30 seconds to increase a film density of the buried oxide film 2b which fills the trench 1a. This annealing may be performed before the removal by CMP or RIE.

Figure 6:
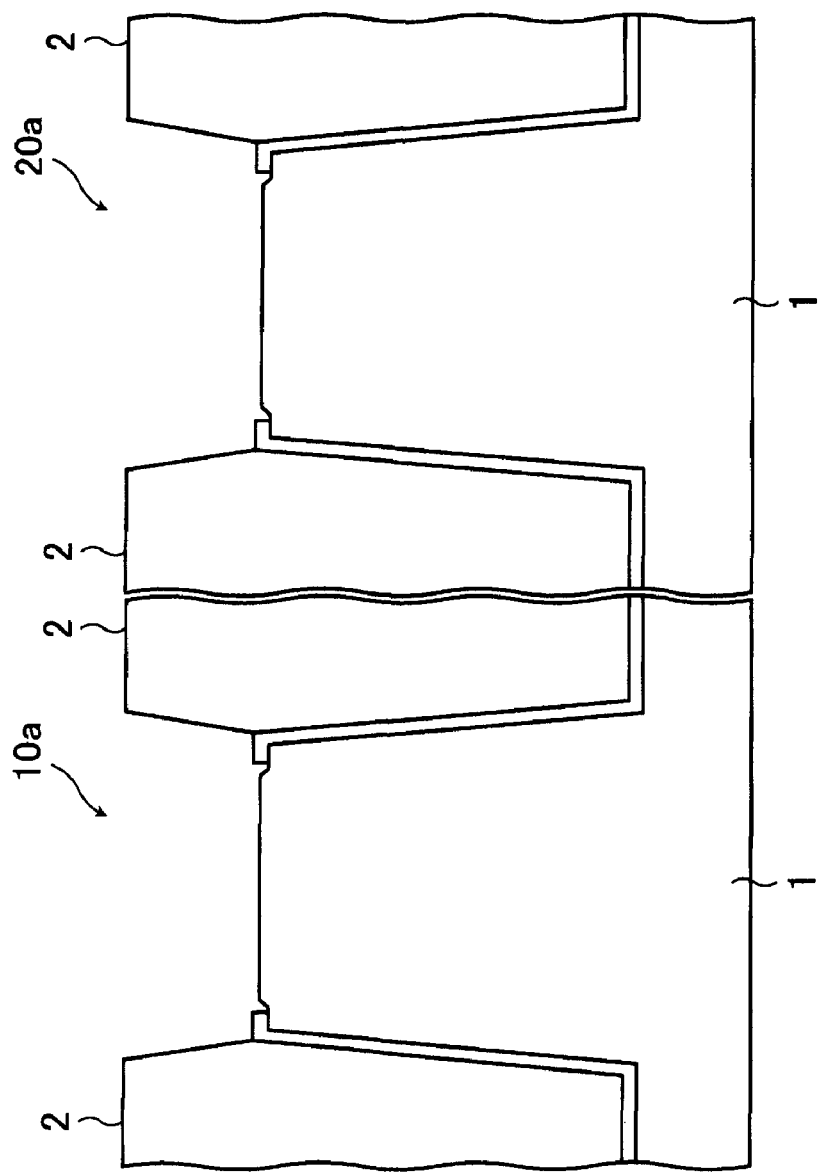
FIG. 6 is a schematic sectional view showing a silicon nitride film and silicon dioxide film removing step.

FIG. 6 is a schematic sectional view showing a silicon nitride film and silicon dioxide film removing step.

The silicon nitride film 4 and silicon dioxide film 3 over an active region are removed by wet etching. Also the buried oxide film 2b is partially removed during this wet etching. Thus, the element isolation region 2 composed of the silicon dioxide film or silicon oxynitride film 2a and the buried oxide film 2b is formed to electrically isolate the HV-Tr forming region 10a and the LV-Tr forming region 20a.

Figure 7:
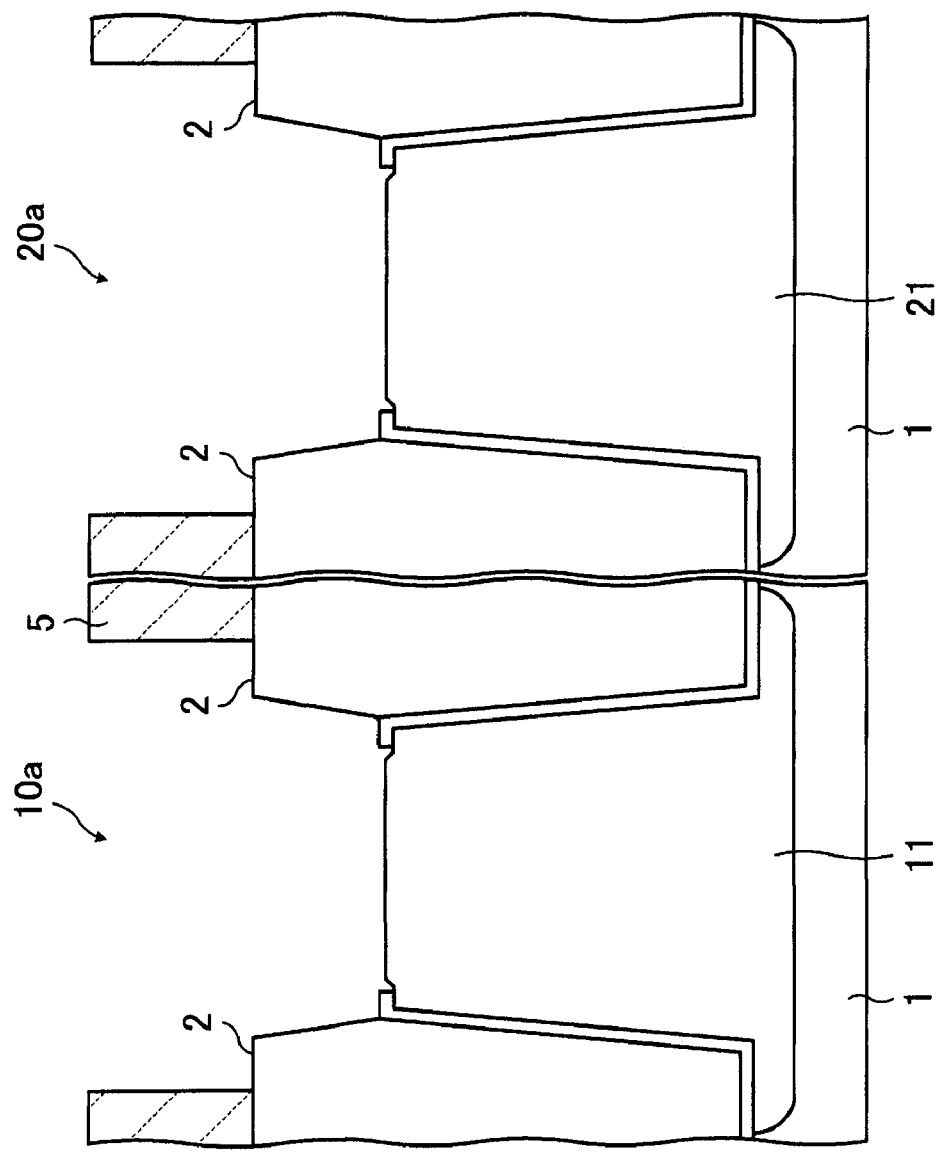
FIG. 7 is a schematic sectional view showing an ion implantation step for formation of a well region.

FIG. 7 is a schematic sectional view showing an ion implantation step for formation of a well region.

After formation of the element isolation region 2, a resist pattern 5 in which both of the HV-Tr forming region 10a and the LV-Tr forming region 20a are opened is first formed using a reticle by a photolithography technique. Then, a predetermined ion implantation is performed using the resist pattern 5 as a mask, thereby forming well regions 11 and 21 in the HV-Tr forming region 10a and the LV-Tr forming region 20a, respectively.

This ion implantation for forming the well regions 11 and 21 is performed as follows. In the case of forming the n-channel HV-Tr 10 and LV-Tr 20, for example, B is implanted under conditions of implantation energy of 150 keV and a dose of $3 \times 10^{13}$ cm$^{-2}$, thereby collectively forming the p-type well regions 11 and 21. In the case of forming the p-channel HV-Tr 10 and LV-Tr 20, for example, P is implanted under conditions of implantation energy of 300 keV and a dose of $3 \times 10^{13}$ cm$^{-2}$, thereby collectively forming the n-type well regions 11 and 21.

Figure 8:
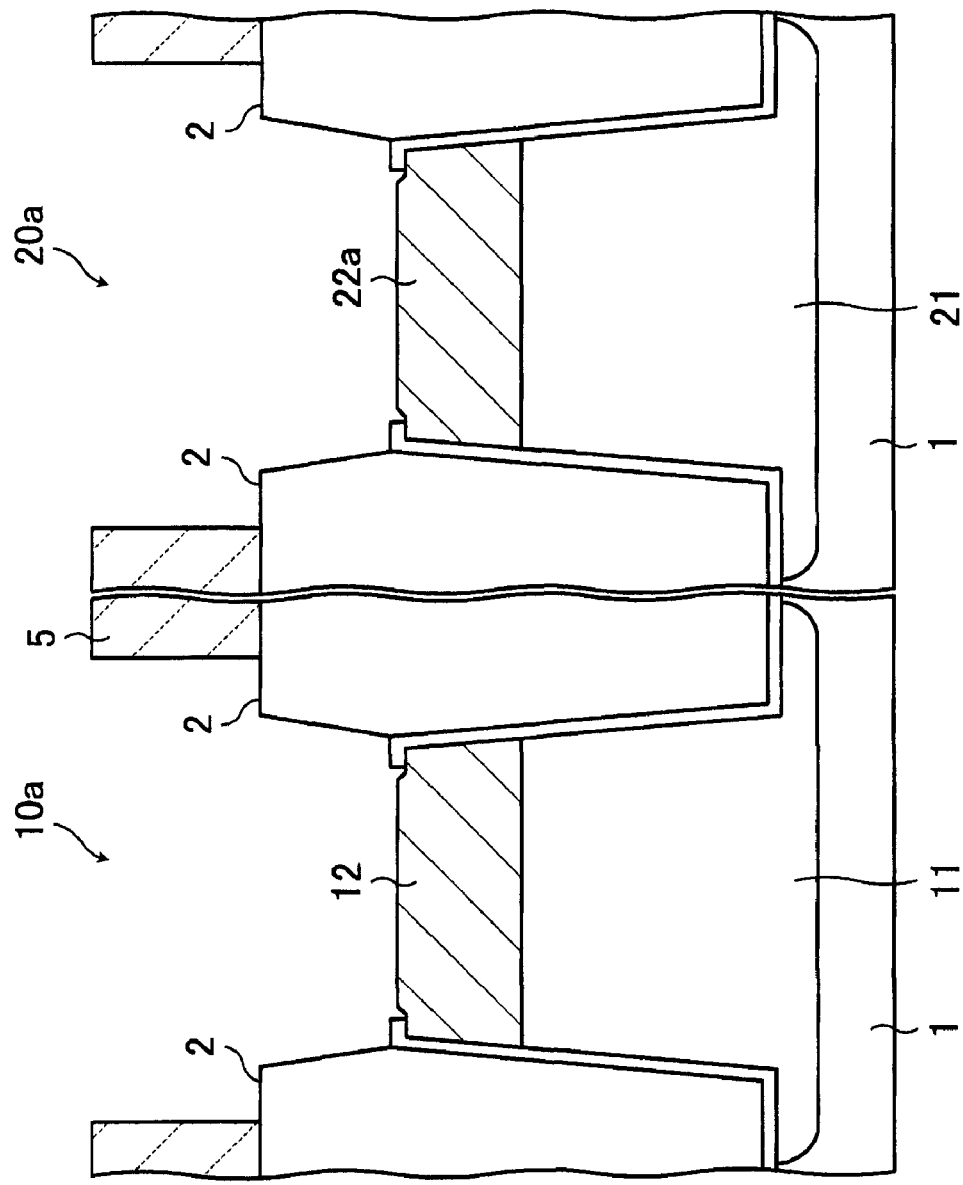
FIG. 8 is a schematic sectional view showing an ion implantation step for Vth adjustment of a HV-Tr.

FIG. 8 is a schematic sectional view showing an ion implantation step for Vth adjustment of the HV-Tr.

After formation of the well regions 11 and 21, the resist pattern 5 used during the ion implantation is continuously used and the ion implantation for Vth adjustment of the HV-Tr 10 is performed into the HV-Tr forming region 10a.

This ion implantation for Vth adjustment is performed as follows. In the case of forming the n-channel HV-Tr 10 and LV-Tr 20, for example, B is implanted under conditions of implantation energy of 10 keV and a dose of $4 \times 10^{12}$ cm$^{-2}$, thereby forming the Vth adjusting region 12 in the HV-Tr forming region 10a. In the case of forming the p-channel HV-Tr 10 and LV-Tr 20, for example, As is implanted under conditions of implantation energy of 100 keV and a dose of $4 \times 10^{12}$ cm$^{-2}$, thereby forming the Vth adjusting region 12 in the HV-Tr forming region 10a.

In this ion implantation, the Vth adjusting region 22a is formed in the LV-Tr forming region 20a simultaneously with the Vth adjusting region 12 of the HV-Tr forming region 10a. Therefore, at this moment, dopant concentrations are equal as well as depths of the dopant concentration peak positions are equal in the Vth adjusting regions 12 and 22a.

The implantation energy used in the ion implantation for forming these Vth adjusting regions 12 and 22a is sufficiently small as compared with that for forming the well regions 11 and 21. Accordingly, depths of the dopant concentration peak positions in the Vth adjusting regions 12 and 22a and in the well regions 11 and 21 are sufficiently different. Therefore, the dopants in the well regions 11 and 21 have little effect on the Vth adjustment of the HV-Tr 10 and the LV-Tr 20.

After thus forming the Vth adjusting regions 12 and 22a, the resist pattern 5 is removed.

Figure 9:
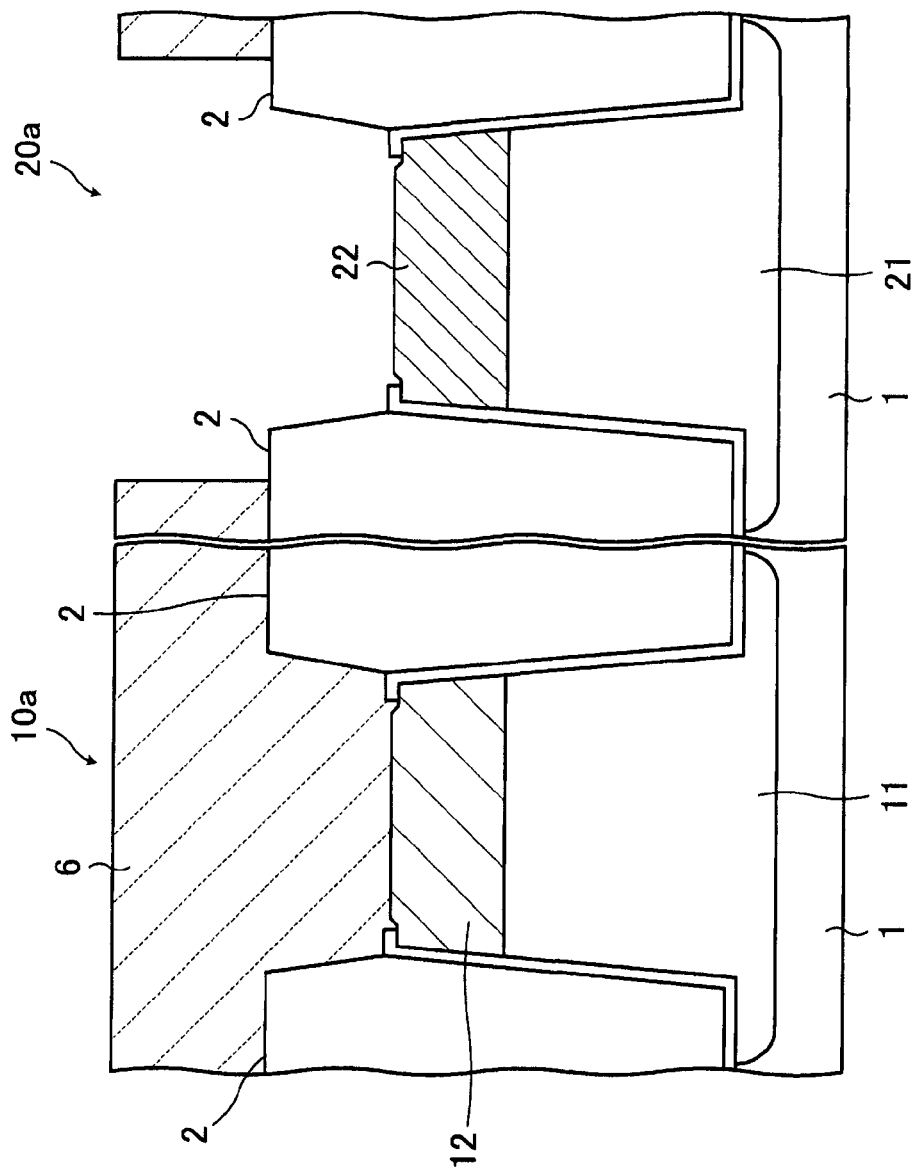
FIG. 9 is a schematic sectional view showing an ion implantation step for Vth adjustment of a LV-Tr.

FIG. 9 is a schematic sectional view showing an ion implantation step for Vth adjustment of the LV-Tr.

After removal of the resist pattern 5 used for formation of the Vth adjusting regions 12 and 22a, a resist pattern 6 in which only the LV-Tr forming region 20a is opened is formed. Using the resist pattern 6 as a mask, the ion implantation for Vth adjustment of the LV-Tr 20 is performed into the LV-Tr forming region 20a.

This ion implantation for Vth adjustment is performed as follows. In the case of forming the n-channel HV-Tr 10 and LV-Tr 20, for example, B is implanted under conditions of implantation energy of 10 keV and a dose of $6 \times 10^{12}$ cm$^{-2}$, thereby forming the Vth adjusting region 22 in the LV-Tr forming region 20a. In the case of forming the p-channel HV-Tr 10 and LV-Tr 20, for example, As is implanted under conditions of implantation energy of 100 keV and a dose of $6 \times 10^{12}$ cm$^{-2}$, thereby forming the Vth adjusting region 22 in the LV-Tr forming region 20a.

In this ion implantation, the same dopant as that implanted during the ion implantation for forming the Vth adjusting regions 12 and 22a in FIG. 8 is implanted at the same implantation energy. Thus, the previously formed Vth adjusting region 22a in FIG. 8 is made to have a higher concentration without changing a depth of the concentration peak position, and the Vth adjusting region 22 for adjusting the Vth of the LV-Tr 20 is finally formed.

After thus forming the Vth adjusting region 22, the resist pattern 6 is removed.

After performing the processing steps from the formation of the well regions 11 and 21 in FIG. 7 to the formation of the Vth adjusting regions 12 and 22 in FIGS. 8 and 9, for example, annealing at 1000° C. for 10 seconds is performed. By performing this annealing, crystal defects within the semiconductor substrate 1 generated by plural times of the ion implantations can be recovered, and anomalous diffusion of dopants due to such crystal defects can be suppressed.

Figure 10:
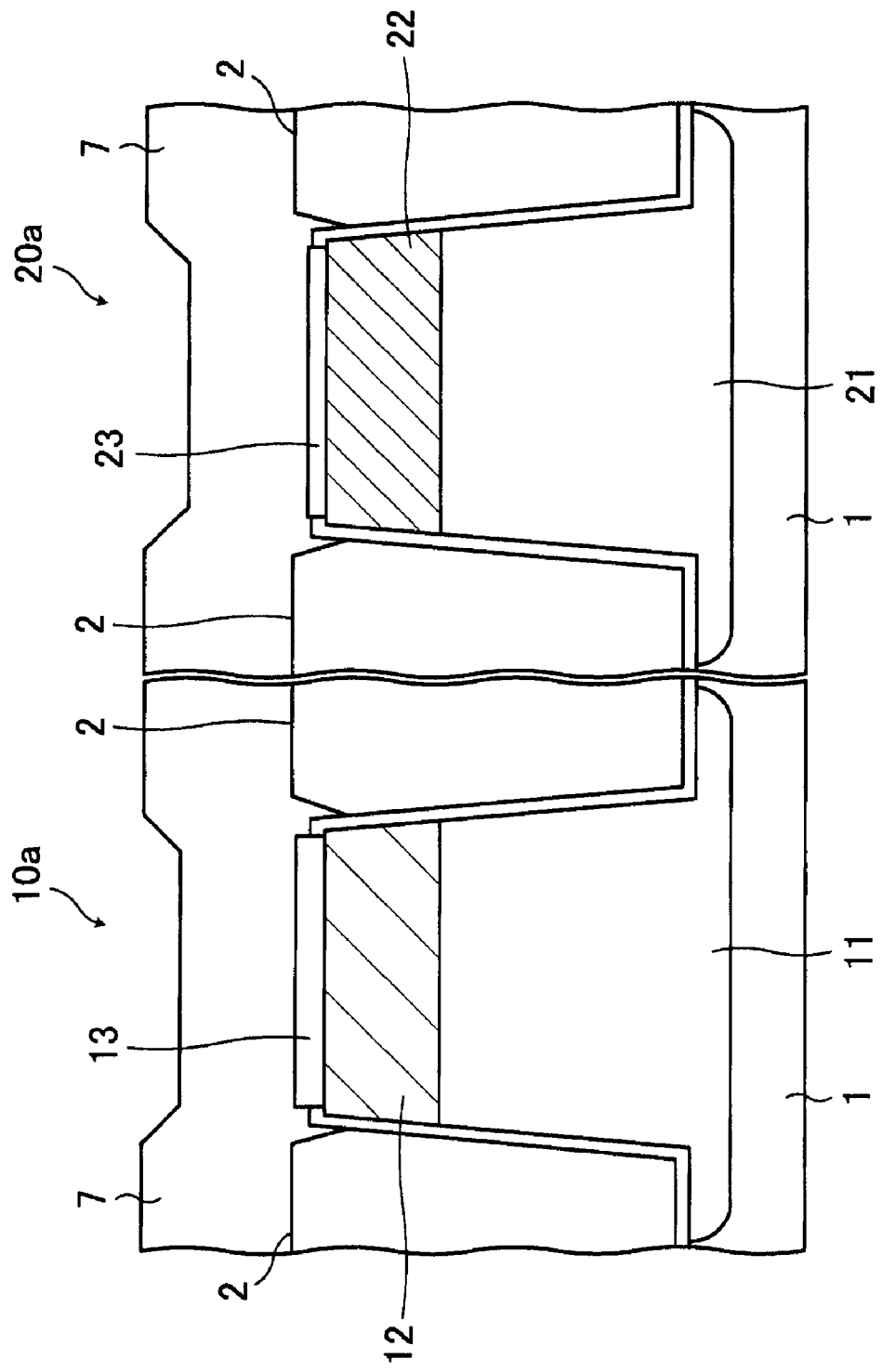
FIG. 10 is a schematic sectional view showing a gate insulating film and polysilicon film forming step.

FIG. 10 is a schematic sectional view showing a gate insulating film and polysilicon film forming step.

After the annealing, gate insulating films 13 and 23 are formed in the HV-Tr forming region 10a and the LV-Tr forming region 20a, respectively.

On this occasion, a first silicon dioxide film having, for example, a thickness of 5 nm is first formed in the HV-Tr forming region 10a and the LV-Tr forming region 20a using a thermal oxidation method or a wet oxidation method. Next, a resist pattern (not shown) in which only the LV-Tr forming region 20a is opened is formed, and the first silicon dioxide film in the LV-Tr forming region 20a is removed using a hydrofluoric acid treatment. Thereafter, the resist pattern is removed and a second silicon dioxide film having, for example, a thickness of 1.2 nm is formed in the LV-Tr forming region 20a using a Rapid Thermal Oxidation (RTO) method. At this time, the first silicon dioxide film is made thicker in the HV-Tr forming region 10a. Thus, the gate insulating films 13 and 23 having different thicknesses are formed in the HV-Tr forming region 10a and the LV-Tr forming region 20a, respectively.

After the formation of the gate insulating films 13 and 23, a polysilicon film 7 having a thickness of 100 nm is deposited over the whole surface using, for example, the CVD method.

Figure 11:
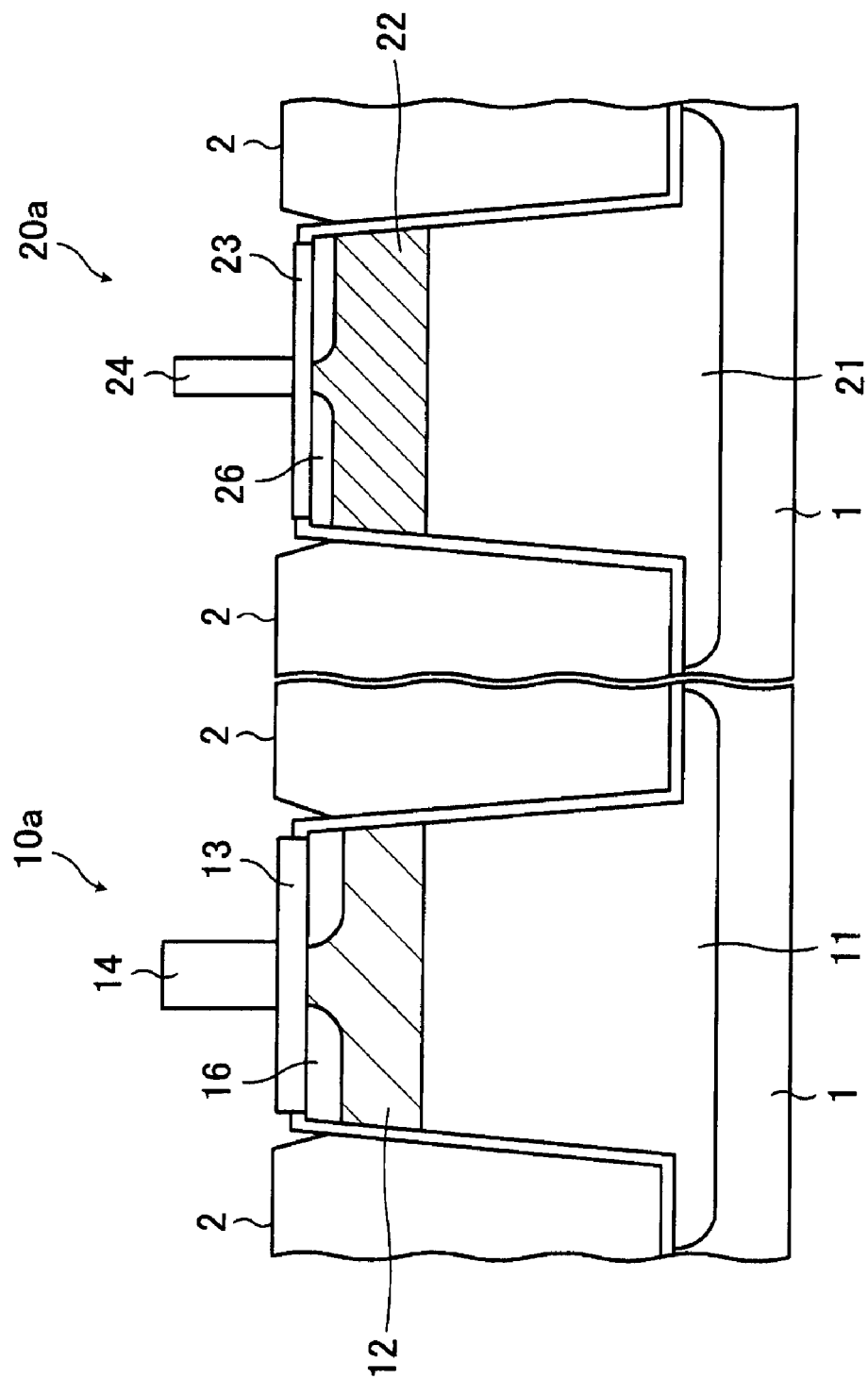
FIG. 11 is a schematic sectional view showing a gate electrode and Lightly Doped Drain (LDD) region forming step.

FIG. 11 is a schematic sectional view showing a gate electrode and LDD region forming step.

Using the photolithography technique, the deposited polysilicon film 7 is processed into a predetermined shape to form gate electrodes 14 and 24 in the HV-Tr forming region 10a and the LV-Tr forming region 20a, respectively. The gate electrode 14 in the HV-Tr forming region 10a is formed to have a larger width in the gate length direction than that of the gate electrode 24 in the LV-Tr forming region 20a.

After the formation of the gate electrodes 14 and 24, the ion implantations are performed into the HV-Tr forming region 10a and the LV-Tr forming region 20a, respectively, to form LDD regions 16 and 26.

In the case of forming the n-channel HV-Tr 10 and LV-Tr 20, the formation of the LDD region 16 is performed as follows. That is, a resist pattern (not shown) in which only the HV-Tr forming region 10a is opened is first formed. Using the resist pattern as a mask, for example, P is then implanted under conditions of implantation energy of 20 keV and a dose of $1\times10^3$ cm$^{-2}$. Further, the formation of the LDD region 26 is performed as follows. That is, a resist pattern (not shown) in which only the LV-Tr forming region 20a is opened is first formed. Using the resist pattern as a mask, for example, As is then implanted under conditions of implantation energy of 3 keV and a dose of $1\times10^{15}$ cm$^{-2}$.

In the case of forming the p-channel HV-Tr 10 and LV-Tr 20, the formation of the LDD region 16 is performed as follows. That is, a resist pattern (not shown) in which only the HV-Tr forming region 10a is opened is first formed. Using the resist pattern as a mask, for example, B is then implanted under conditions of implantation energy of 3 keV and a dose of $1\times10^{13}$ cm$^{-2}$. Further, the formation of the LDD region 26 is performed as follows. That is, a resist pattern (not shown) in which only the LV-Tr forming region 20a is opened is first formed. Using the resist pattern as a mask, for example, B is then implanted under conditions of implantation energy of 0.5 keV and a dose of $1\times10^{15}$ cm$^{-2}$.

After the formation of the LDD regions 16 and 26, the sidewalls 15 and 25 are formed on the side walls of the gate electrodes 14 and 24, as shown in FIG. 2. Then, the ion implantation is performed to form the source/drain regions 17 and 27.

In that case, a silicon dioxide film having a thickness of 60 nm is first deposited over the whole surface using, for example, a CVD method. Then, an entire surface etch-back by plasma etching is performed on the silicon dioxide film and the sidewalls 15 and 25 having, for example, a thickness of 60 nm are formed on the side walls of the gate electrodes 14 and 24, respectively.

Thereafter, the ion implantation for formation of the source/drain regions 17 and 27 is performed into the HV-Tr forming region 10a and the LV-Tr forming region 20a. In the case of forming the n-channel HV-Tr 10 and LV-Tr 20, the ion implantation for formation of the source/drain regions 17 and 27 is performed by implanting, for example, P under conditions of implantation energy of 15 keV and a dose of $2\times10^{15}$ cm$^{-2}$. In the case of forming the p-channel HV-Tr 10 and LV-Tr 20, the ion implantation for formation of the source/drain regions 17 and 27 is performed by implanting, for example, B under conditions of implantation energy of 5 keV and a dose of $2\times10^{15}$ cm$^{-2}$.

After this ion implantation, for example, annealing at 1000° C. for 3 seconds is performed to activate the implanted dopant. Thus, a semiconductor device including the HV-Tr 10 and LV-Tr 20 mixedly mounted as shown in FIG. 2 is formed. Afterwards, formation of interlayer insulating films and wirings may be performed according to an ordinary method.

Between the formation of the well regions 11 and 21 in FIG. 7 and the formation of the Vth adjusting regions 12 and 22 in FIGS. 8 and 9, it is only necessary to prepare two sheets of reticles for formation of the resist patterns 5 and 6. Therefore, the number of reticles used can be reduced as compared with a conventional method using three reticles. Further, it is only necessary to form two types of the resist patterns 5 and 6. Therefore, one resist removing step can be reduced as compared with a conventional method using three types of resist patterns. When a semiconductor device has a CMOS structure, one resist removing step can be reduced in each of an n-channel side and a p-channel side, that is, a total of two resist removing steps can be reduced. When the resist removing step can be thus reduced, the following effect can also be obtained.

Figure 12:
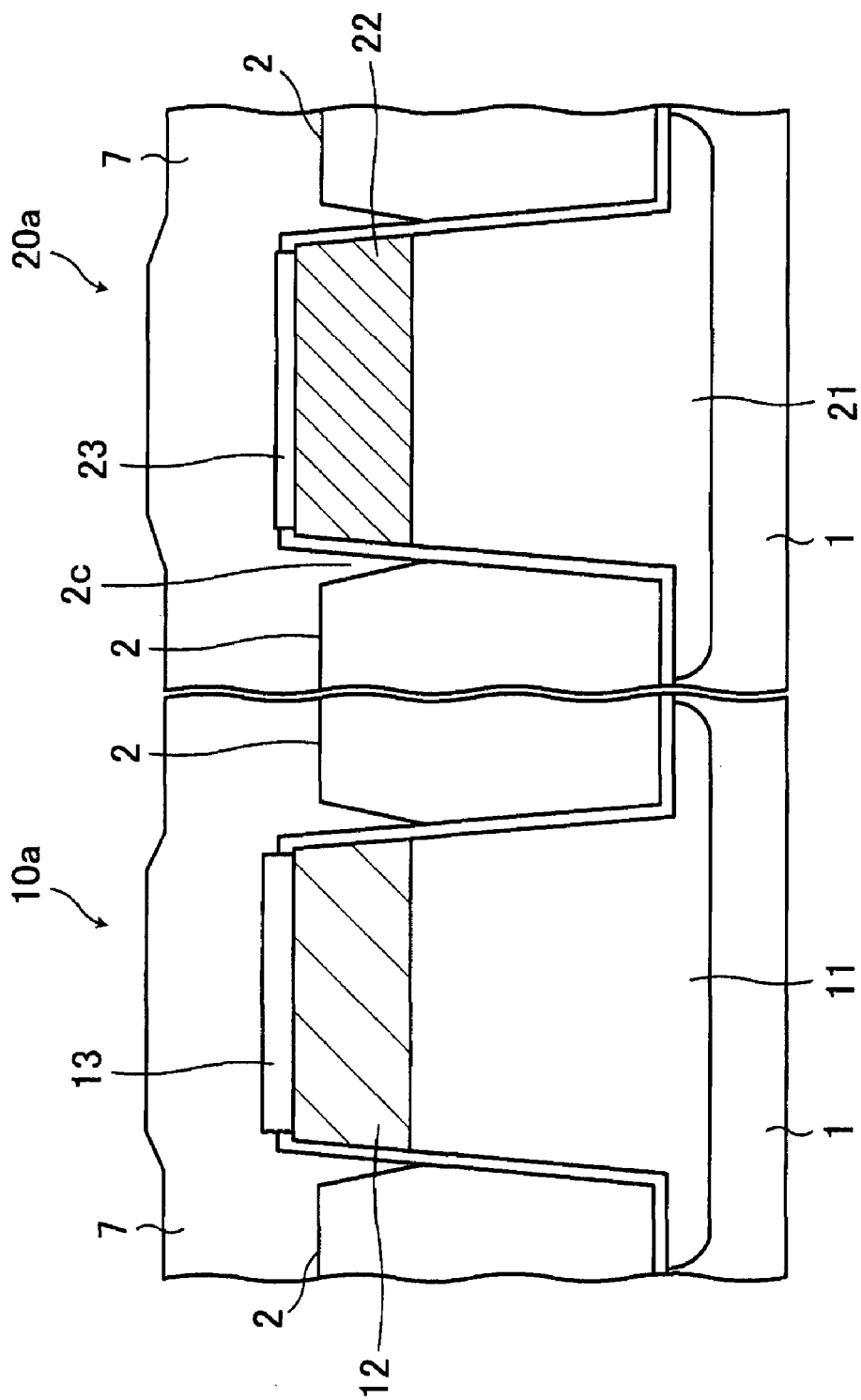
FIG. 12 illustrates a reduction effect of a resist removing step.

FIG. 12 illustrates a reduction effect of a resist removing step.

FIG. 12 shows a state where the well regions 11 and 21 and the Vth adjusting regions 12 and 22 are formed (corresponding to FIGS. 7 to 9) by a conventional method using three types of resist patterns and the steps until formation of the polysilicon film 7 are performed (corresponding to FIG. 10).

When the above-described steps in FIGS. 7 to 9 are used, the resist removing step can be reduced as compared with the conventional method. Therefore, it becomes possible to suppress occurrence of film reduction in the element isolation region 2 as shown in FIG. 12 due to wet processing such as resist stripping or cleaning. Further, it also becomes possible to suppress occurrence of a divot 2c at the edge of the element isolation region 2.

When large film reduction occurs in the element isolation region 2 as shown in FIG. 12, the following problem occurs. That is, when a subsequent step of depositing the polysilicon film 7 on the element 2 to perform gate fabrication by a photolithography technique is performed, defocusing during exposure occurs to increase the likelihood that sizes (gate lengths) of the gate electrodes 14 and 24 fluctuate. When large divots 2c are formed in the element isolation region 2, the following problem occurs. That is, when a subsequent step of depositing and processing the polysilicon film 7 to form the gate electrodes 14 and 24 is performed, the polysilicon film 7 easily remains at such portions and unwanted particles are generated from the portions to increase the likelihood of causing performance degradation. In the case of employing the steps of FIGS. 7 to 9, the film reduction of the element isolation region 2 and the occurrence of the divots 2c can be suppressed. Therefore, the above-described problems can be avoided.

In the example shown in FIG. 2 and FIGS. 4 to 11, a pocket region may be formed near the LDD region 16 depending on the gate length of the gate electrode 14 of the HV-Tr 10 so as to improve the roll-off characteristics.

In that case, a resist pattern in which only the HV-Tr forming region 10a is opened is first formed, for example, between after the formation of the gate electrodes 14 and 24 shown in FIG. 11 and before the formation of the LDD region 16 shown in FIG. 11. Then, using the resist pattern as a mask, a predetermined dopant having a conductivity type opposite to that of the LDD region 16 is obliquely implanted into the HV-Tr forming region 10a at predetermined implantation energy and dose. Afterwards, continuously using the resist pattern, formation of the LDD regions 16 and 26 may be performed as illustrated in FIG. 11.

In the example shown in FIG. 2 and FIGS. 4 to 11, the Vth adjusting regions 12, 22a and 22 shown in FIGS. 8 and 9 are formed using the same dopant. The regions 12, 22a and 22 can also be formed using different dopants.

In that case, ion implantation is first performed using the resist pattern 5 to form the Vth adjusting regions 12 and 22a as shown in FIG. 8. This ion implantation is performed under the conditions shown in the above example. That is, in the case of forming the n-channel HV-Tr 10 and LV-Tr 20, for example, B is implanted under conditions of implantation energy of 10 keV and a dose of $4\times10^{12}$ cm$^{-2}$. In the case of forming the p-channel HV-Tr 10 and LV-Tr 20, for example, As is implanted under conditions of implantation energy of 100 keV and a dose of $4\times10^{12}$ cm$^{-2}$.

Then, the resist pattern 5 is removed and the subsequent forming step of the Vth adjusting region 22 shown in FIG. 9 is performed, in which using a dopant having a mass number larger than that of B or As previously used, ion implantation is performed using the resist pattern 6. This ion implantation is performed under the following conditions. In the case of forming the n-channel HV-Tr 10 and LV-Tr 20, for example, In is implanted under conditions of implantation energy of 60 keV and a dose of $1\times10^{13}$ cm$^{-2}$. In the case of forming the p-channel HV-Tr 10 and LV-Tr 20, for example, Sb is implanted under conditions of implantation energy of 120 keV and a dose of $1\times10^{13}$ cm$^{-2}$.

When a dopant having a large mass number is thus used in the forming step of the Vth adjusting region 22 in FIG. 9, conditions during the ion implantation are set such that a depth of the concentration peak position of the dopant is equal to, including a case of the same as, that of a dopant in the Vth adjusting region 22a previously formed in the step of FIG. 8.

After the formation of the Vth adjusting region 22, removal of the resist pattern 6 and predetermined annealing may be performed to sequentially perform the step in FIG. 10 and the subsequent steps.

When the Vth adjusting region 22 is thus formed using a dopant having a larger mass number after the formation of the Vth adjusting regions 12 and 22a, the LV-Tr 20 suppressed in short channel effect can be obtained as well as the HV-Tr 10 suppressed in leakage current can be obtained.

As described above, when using the above-described forming method, a semiconductor device including the HV-Tr 10 and the LV-Tr 20 mixedly mounted and having a predetermined performance can be efficiently formed at low cost.

In the present invention, when first and second transistors having the same channel type and having different operating voltages are formed, ion implantation for Vth adjustment of the first transistor is performed using a first mask pattern used for formation of well regions, and ion implantation for Vth adjustment of the second transistor is performed using a second mask pattern. As a result, the forming step/removing step of the mask pattern and the number of reticles used can be reduced, so that a mixed-mounting type semiconductor device can be efficiently formed at low cost while securing a constant performance.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor device, comprising:
    forming over a semiconductor substrate a first mask pattern in which a first region for forming a first transistor as well as a second region for forming a second transistor having the same channel type as that of the first transistor are opened;
    performing a first ion implantation to implant, using the first mask pattern, a first dopant into the first region and the second region to form well regions;
    performing a second ion implantation to implant, using the first mask pattern, a second dopant into the first region and the second region to adjust a threshold voltage (Vth) of the first transistor;
    removing the first mask pattern and forming a second mask pattern in which the first region is covered and the second region is opened;
    performing a third ion implantation to implant, using the second mask pattern, a third dopant into the second region to adjust a Vth of the second transistor;
    forming a first gate insulating film in the first region and forming a second gate insulating film in the second region, the second gate insulating film being thinner than the first gate insulating film; and
    forming a first gate electrode over the first gate insulating film of the first region and forming a second gate electrode over the second gate insulating film of the second region, the second gate electrode having a gate length shorter than that of the first gate electrode; wherein
    in the second and third ion implantation, the second dopant and the third dopant are dopants comprising the same constituent element and are implanted at the same energy.

2. The method according to claim 1, wherein:
    in the first ion implantation, conditions are set such that a concentration peak position in a depth direction of the first dopant in the well region is deeper than those of the second dopant and the third dopant.

3. The method according to claim 1, further comprising, after forming the first and second gate electrodes:
    forming LDD regions in the first and second regions;
    forming sidewall spacers on the sidewalls of first and second gate electrodes; and
    forming source/drain regions in the first and second regions.

4. The method according to claim 1, further comprising, after forming the first and second gate electrodes:
    forming a pocket region in the first region of the semiconductor substrate.

5. A method of manufacturing a semiconductor device, comprising:
    forming over a semiconductor substrate a first mask pattern in which a first region for forming a first transistor as well as a second region for forming a second transistor having the same channel type as that of the first transistor are opened;
    performing a first ion implantation to implant, using the first mask pattern, a first dopant into the first region and the second region to form well regions;
    performing a second ion implantation to implant, using the first mask pattern, a second dopant into the first region and the second region to adjust a threshold voltage (Vth) of the first transistor;
    removing the first mask pattern and forming a second mask pattern in which the first region is covered and the second region is opened;

performing a third ion implantation to implant, using the second mask pattern, a third dopant into the second region to adjust a Vth of the second transistor;

forming a first gate insulating film in the first region and forming a second gate insulating film in the second region, the second gate insulating film being thinner than the first gate insulating film; and forming a first gate electrode over the first gate insulating film of the first region and forming a second gate electrode over the second gate insulating film of the second region, the second gate electrode having a gate length shorter than that of the first gate electrode; wherein in the third ion implantation, the third dopant has a mass number larger than that of the second dopant and is implanted such that a depth of a concentration peak position of the third dopant is equal to that of the second dopant.

6. The method according to claim 5, wherein:

in the first ion implantation, conditions are set such that a concentration peak position in a depth direction of the first dopant in the well region is deeper than those of the second dopant and the third dopant.

7. The method according to claim 5, further comprising, after forming the first and second gate electrodes:

forming LDD regions in the first and second regions;

forming sidewall spacers on sidewalls of the first and second gate electrodes; and forming source/drain regions in the first and second regions.

8. The method according to claim 5, further comprising, after forming the first and second gate electrodes:

forming a pocket region in the first region of the semiconductor substrate.

* * * * *